US008989329B2

(12) United States Patent
Hammad et al.

(10) Patent No.: US 8,989,329 B2
(45) Date of Patent: Mar. 24, 2015

(54) EYE WIDTH MEASUREMENT AND MARGINING IN COMMUNICATION SYSTEMS

(71) Applicant: Intel Corporation, Santa Clara, CA (US)

(72) Inventors: Dima Hammad, Jerusalem (IL); Vadim Levin, Jerusalem (IL); Amir Laufer, Petach Tiqwa (IL); Ron Bar-Lev, Mizrach Binyamin (IL); Noam Familia, Modiin (IL); Itamar Levin, Holon (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/836,383

(22) Filed: Mar. 15, 2013

(65) Prior Publication Data

US 2014/0270030 A1 Sep. 18, 2014

(51) Int. Cl.
*H04L 7/00* (2006.01)
(52) U.S. Cl.
CPC ............ *H04L 7/0079* (2013.01); *H04L 7/0016* (2013.01)
USPC ........... 375/355; 375/224; 375/371; 375/375; 375/376
(58) Field of Classification Search
CPC ......... H03L 7/07; H03L 7/0814; H03L 7/085; H03L 7/0995; H03L 7/0996; H03L 7/087; H03L 7/093; H03L 7/143; H03L 7/18; G09G 5/008
USPC ......... 375/355, 357, 359, 364, 371, 373, 376, 375/374, 375
See application file for complete search history.

(56) References Cited

U.S. PATENT DOCUMENTS 7,288,975 B2 * 10/2007 Ngo et al. ...................... 327/156
8,559,580 B2 * 10/2013 Dai et al. ........................ 375/371

OTHER PUBLICATIONS

Chan, et al., "A Synthesizable, Fast and High-Resolution Timing Measurement Device Using a Component-Invariant Vernier Delay Line", Microelectronics and Computer Systems Laboratory, McGill University, IEEE, 2001, pp. 858-867.
Hsiao, et al., "A Built-In Parametric Timing Measurement Unit", Built-In Measurement Unit, IEEE Design & Test of Computers, IEEE, Jul.-Aug. 2004, pp. 322-330.
Huang, et al. "An On-Chip Short-Time Interval Measurement Technique for Testing High-speed Communication Links", Department of Electrical and Computer Engineering, University of California, Santa Barbara, IEEE, 2001, pp. 380-385.
(Continued)

*Primary Examiner* — Dhaval Patel
(74) *Attorney, Agent, or Firm* — Grossman, Tucker, Perreault & Pfleger, PLLC

(57) ABSTRACT

Generally, this disclosure describes eye width measurement and margining in communication systems. An apparatus may be configured to: decouple a phase detector from a CDR loop filter of a receiver under test in response to synchronizing a margining clock signal to a receiver clock signal; apply a margining input to the loop filter, the margining input configured to shift a frequency of the margining clock signal by a constant amount related to the margining input; compare a first bit stream and a second bit stream and configured to detect an error, the first bit stream related to a transmitted bit stream; and count cycles of the receiver clock signal or the margining clock signal, wherein an eye width associated with the receiver under test is related to the margining input, the frequency of the receiver clock signal and a count of clock cycles when the error is detected.

20 Claims, 9 Drawing Sheets

(56) References Cited

OTHER PUBLICATIONS

Jenkins, et al., "An On-chip Jitter Measurement Circuit with Sub-picosecond Resolution", Proceedings of ESSCIRC, Grenoble, France, 2005, pp. 157-160.

Levin, et al., "KR Eye-Width Margining", Based on internal frequency PPM generation in the CDR, 7 Pages.

Rivoir, Jochen, "Fully-Digital Time-To-Digital Converter for ATE with Autonomous Calibration", International Test Conference, IEEE, 2006, pp. 1-10.

Sattler, et al., "PLL Built-In-Self-Test Jitter Measurement Integration into 0.18u CMOS Technology", Infineon Technologies AG, Balanstr. 73, 81541 Munich, Germany, Jan. 2001, 5 Pages.

Sunter, Stephen, "On-Chip Digital Jitter Measurement, from Megahertz to Gigahertz", Testing at MultiGbps Rates, IEEE Design & Test of Computers, IEEE, Jul.-Aug. 2004, pp. 314-321.

Sunter, et al., "Purely Digital BIST for any PLL or DLL", 12th IEEE European Test Symposium (ETS'07), 2007, 6 Pages.

Sunter, et al., "Structural Tests for Jitter Tolerance in SerDes Receivers", International Test Conference, IEEE, 2006, pp. 1-10.

Abidi, Asad A., "Phase Noise and Jitter in CMOS Ring Oscillators", IEEE Journal Of Solid-State Circuits, vol. 41, No. 8, Aug. 2006, pp. 1803-1816.

\* cited by examiner

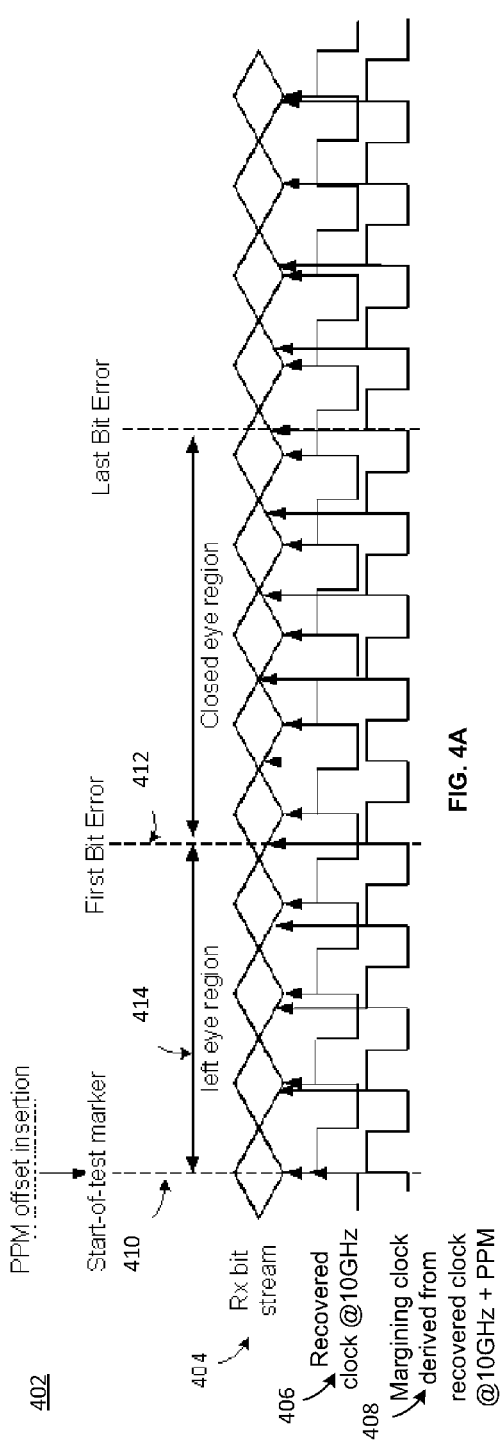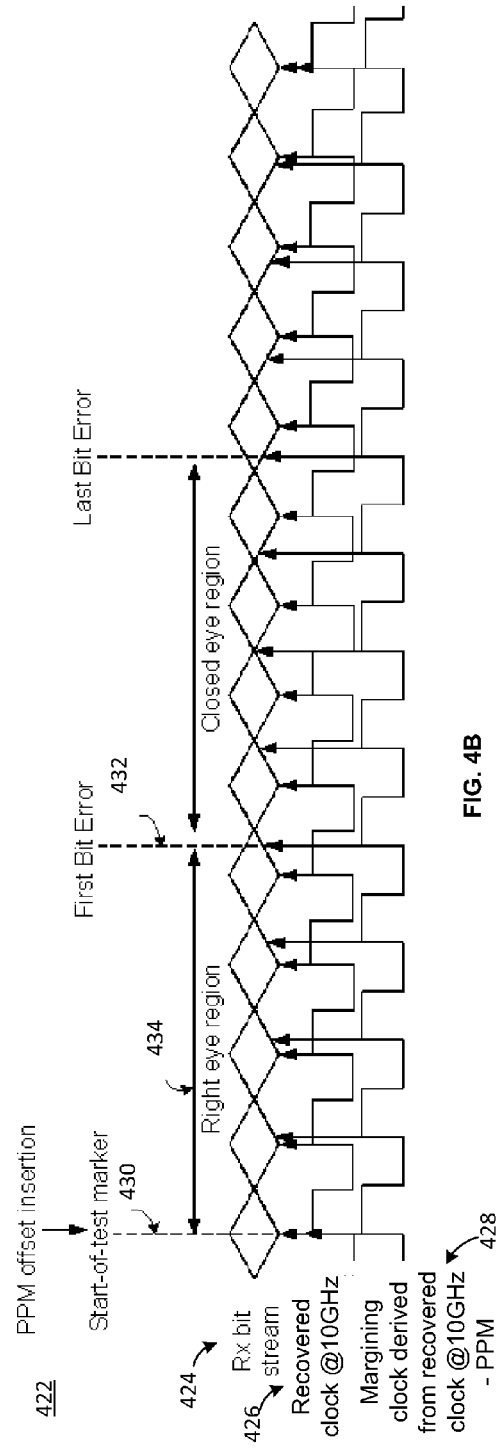

EYE WIDTH MEASUREMENT AND MARGINING IN COMMUNICATION SYSTEMS

FIELD

This disclosure relates to eye width measurement, more particularly eye width measurement and margining in communication systems.

BACKGROUND

Today's SoCs (System on Chip) and processor products for client, server and mobile applications rely on high speed data communication links in order to communicate large amounts of data across the motherboard or computer/server rack backplane between data sources and destinations. Serial IO (input/output) links (e.g., SERDES, Serializer-Deserializer systems) are among the most common types of high speed IOs in use today, e.g., where a 32 bit (or more) bus is being serialized into a single high speed physical wire-line (e.g., wired) and/or wireless channel. There are many types and families of serial IOs, including PCIe (Peripheral Component Interconnect Express), SATA (Serial ATA), KTI, QPI (QuickPath Interconnect) and wire-line Ethernet links, each with corresponding benefits and characteristics. Links with symbol rates of 5, 8 or 10 GB/sec per physical channel are in relatively wide use, and even higher rates may be possible and are contemplated for commercial use.

In high speed serial data communication links employing NRZ (non-return to zero), PSK (phase shift keying) and PAM (pulse amplitude modulation) modulations, Bit Error Rate (BER), Time-to-Link (TTL) and eye measurements are relatively common metrics for evaluating link performance. A link specification typically includes maximum permissible values for BER and TTL. In order to qualify a link, it must have BER and TTL that are less than these maximums. When designing serial links for high volume systems, merely meeting these criteria is not enough to ensure robust performance over the entire ensemble of scenarios and tolerances that may be experienced in the field. Rather, good design practices suggest that the serial link design include additional operational margins that will ensure performance in degraded conditions. Such margins and their measurement are a central part of a product production quality process.

Link characterization by margining the information bearing signal eye pattern at the receiver decision junction (e.g., at an input to data slicer(s) that are configured to determine whether a signal corresponds to a logic zero or a logic one) is a generally accepted margining method. An eye pattern specification may generally include an eye mask that provides eye opening minimum requirements in order to meet a desired link BER requirement. However, in order to provide a more robust design, communication systems are typically designed to obtain a more desirable performance margin by expanding an area around the eye mask and using the expanded area as the minimum eye opening target.

In order to qualify a link, test data is typically required showing that the link BER is below the specified maximum BER, the time-to-link is below the maximum time-to-link and the eye opening does not impinge on the eye mask. In a relatively low speed SERDES circuit, eye pattern measurements are typically performed very close to an input to a data slicer that makes the decision whether a received bit is a zero or a one. However, in high speed links, accessing this point with external test equipment is generally difficult and may degrade performance. Further, test equipment access is usually limited to the Receiver input terminals (which are not where the actual eye after processing by the receiver may be measured). Thus, high speed data links provide a particular challenge for testing.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

FIGS. 4A and 4B illustrate examples of waveforms generated during eye margin characterizations performed using a method consistent with the present disclosure;

Figure 1:
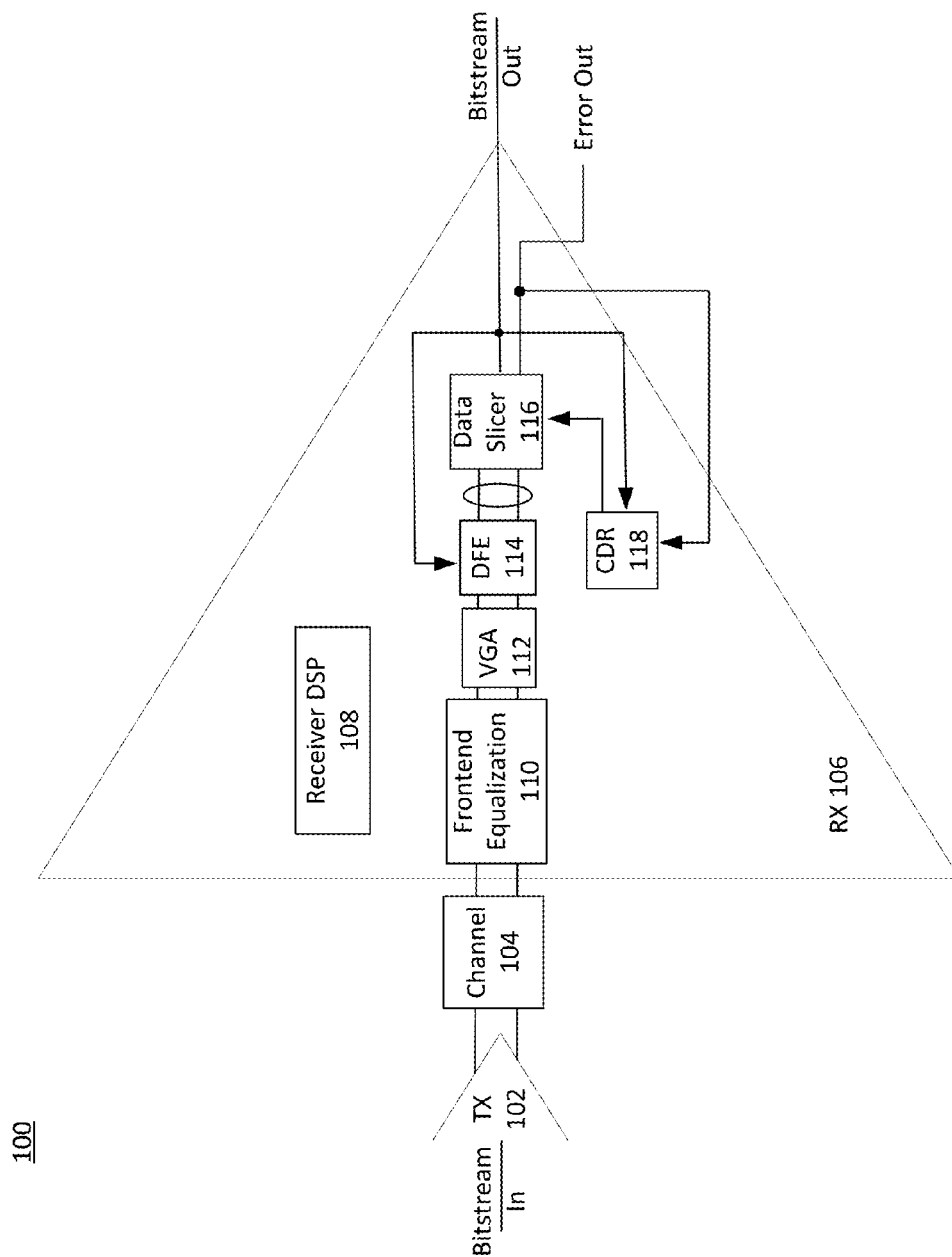
FIG. 1 illustrates a communication system consistent with various embodiments of the present disclosure.

Although the following Detailed Description will proceed with reference being made to illustrative embodiments, many alternatives, modifications, and variations thereof will be apparent to those skilled in the art.

DETAILED DESCRIPTION

Generally, this disclosure describes an apparatus, system and method for measurement, characterization and margining an eye pattern for a relatively high speed communication system. In particular, an eye-width (e.g., horizontal dimension of the eye pattern) measuring and margining topology is described that may be used for receiver clock and data recovery (CDR) circuits that employ voltage controlled oscillators (VCOs) and/or digitally controlled oscillators (DCOs). An eye pattern may be characterized using a known pseudorandom bit sequence (PRBS) and/or an unknown bit sequence (e.g., actual data). The system and method may be further applied to phase interpolation (PI) based CDR circuits. The method may be implemented on-die, using circuitry available on-die. In one example, the method is configured to provide a resolution on the order of 0.5 picosecond for a 10 GB/sec data signal.

Using an existing PI-based CDR topology, an eye measurement may be performed as follows. A receiver is allowed to adapt and stabilize, and after a particular bit-error-rate (BER) has been achieved, the CDR circuit is precisely locked on a correct data slicer sampling instance ("ideal" sampling instance). Lock may be determined based on received signals and/or lock may be assumed after a sufficient time period has elapsed configured to allow initialization transients to subside and the system to achieve steady state. All equalizers and amplifier coefficients are then fixed at their current values. A pseudorandom bit sequence (PRBS) may then be transmitted from the transmitter to the receiver. The receiver, knowing the bit sequence a priori, may then relatively easily detect errors in the received bit stream. A phase shift may then be added to the sampling instance so that the data slicer now samples at a horizontal displacement from the ideal sampling instance. Sampling continues until an error is detected, at which point the phase shift is recorded and that test round ends. This process is repeated many times in order to accumulate data for averaging so as to improve the statistical properties of the result. The phase shift may then be increased by an incremental amount and the process repeated. This PI-based procedure scans the eye to the right of the ideal sampling instance. The PI-based procedure may be repeated while subtracting phase shifts in order to scan the eye to the left of the ideal sampling instance, thus scanning the full eye width.

There are several limitations and drawbacks of this PI-based procedure for scanning the eye width using PI-based CDR circuits. Its implementation is limited to PI-based CDRs and may not be adaptable to voltage controlled oscillator (VCO) based CDR circuitry. The resolution associated with the described PI-based procedure is limited by a differential nonlinearity associated with the PI (typically on the order of 2.5 to 5.0 picoseconds, in current technology). In relatively high data rate communication systems (e.g., greater than or equal to 10 GB/sec), such resolution is a serious limiting factor that typically requires circuit level optimization and tuning to achieve. The PI-based procedure may not be suitable for fully digital CDR architectures. For a communication system, e.g., SERDES, that includes a decision feedback equalizer (DFE), the PI-based procedure may be utilized only until a first error is detected unless a unique slicer is used for eye-width measurements and a unique slicer is used for data detection. If a single slicer is used, then when an error is detected, DFE error multiplication (due to the feedback) may cause a transient eye closure and possibly a burst of errors that will require halting the test procedure and re-adaptation of the CDR circuitry and the channel before the test may continue. This may increase the time to perform the test and may distort its result. The phase interpolator used for this PI-based procedure typically requires a linear phase interpolator that has to be calibrated in order to quantify the test results. Such calibration can be a complex (e.g., time consuming) and relatively expensive procedure. The PI-based procedure cannot be implemented entirely on-die. Rather, relatively expensive external test equipment is generally used to calibrate and process measurement results.

One benefit of the PI-based procedure is that it is configured to characterize the eye width while the CDR operates closed loop. A PI-based CDR typically includes two control loops that operate independently. A first control loop is a frequency acquisition and tracking loop that may be analog or digital and a second control loop is a phase acquisition (e.g., symbol timing) and tracking loop that also may be analog or digital. Since the second loop is configured to track symbol (e.g., bit) timing directly, a timing shift (e.g., phase shift) may be applied relatively easily through selection of a different PI phase in each UI (symbol/bit unit interval). For a VCO-based CDR, the phase may not be programmed directly since there is only one control loop that controls the frequency. As a result of frequency modification, the phase may also be shifted. Moreover, while operating in closed loop, any phase increment/decrement (that might be applied to the CDR through frequency offset) may result in phase correction of the control loop.

A system and method consistent with the present disclosure are configured to address at least some of the described short-comings of existing PI-based procedures. The system and method may be utilized in VCO-based CDR architectures as well as PI-based CDR architectures with analog or digital or mixed implementations and is configured to operate at data rates, including, but not limited to, 10 GB/sec and higher.

FIG. 1 illustrates a communication system 100 that includes a transmitter (TX) 102, a channel 104 and a receiver (RX) 106. The transmitter 102 is configured to receive serial data in ("bit stream in"), configure the serial input data (e.g., combine the data with a clock signal) for transmission and transmit the clock and data down channel 104 to receiver 106. Receiver 106 is configured to receive and process the received clock and data signal and to provide the serial data out ("bit stream out"). During transmission the serial data input may be distorted by, among other things, bandwidth limitations of the channel 104, attenuation associated with the channel 104, noise, etc. The receiver 106 is configured to process the received clock and data signal to recover the bit stream in and to provide as output a corresponding bit stream out.

The receiver 106 may include a receiver digital signal processing module RxDSP, a microprocessor and/or logic circuits 108 configured to perform digital signal processing activities for the receiver 106, an equalizer 110, a variable gain amplifier VGA 112, decision feedback equalizer DFE 114, a data slicer module 116 and a clock and data recovery module (CDR) 118. The equalizer 110 is configured to amplify higher frequency components of the received signal to compensate for the bandwidth limitations of the channel and the VGA 112 is configured to amplify the equalized signal. The DFE 114 is configured to perform further equalization to reduce inter-symbol interference using, e.g., feedback from the data slicer module 116.

Data slicer module 116 may include one or more data slicers that are configured to discretize and sample the received, amplified and equalized signal from the DFE 114. During normal operation, the data slicer module 116 is further configured to receive a recovered clock signal from CDR 118 that synchronizes the sampling and discretizing with a clock extracted from the received signal. The CDR 118 receives both a receiver bit stream from the data slicer module 116 as well as an error output signal configured to indicate received signals outside a reference voltage range (±Vref). Receiver 106 relies on CDR 118 for clock and data recovery in order to recover the bit stream in from the received signal that has been attenuated and filtered by the channel 104.

Figure 2:
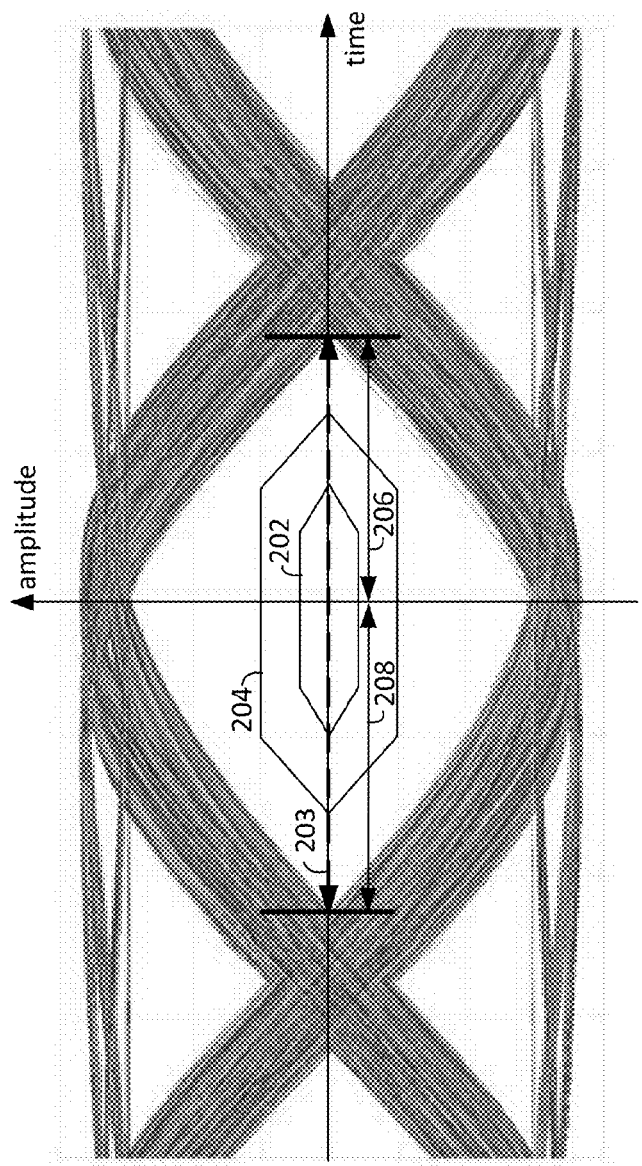
FIG. 2 is an example of an eye pattern that may be used to characterize a communication system.

FIG. 2 is an example of an eye pattern 200 that may be used to characterize a communication system. The vertical axis corresponds to amplitude and the horizontal axis corresponds to time. An ideal sampling instance may be defined as a point in a unit interval where a signal to noise ratio is maximum and may correspond to the vertical axis in some cases. An eye pattern may be generated by a sequence of bits (bit stream that may include clock and data information) and provides an indication of margin associated with the communication system. A critical eye opening 202 may be specified in order to achieve a desired (and/or required) BER. For design, a larger opening, e.g., region 204 may be specified in order to ensure a margin and a greater likelihood that the communication system may continue to operate under less than optimal conditions. In order to qualify a communication system, generating an eye diagram may be desirable. In particular, determining an eye width 203 may provide an indication of sensitivity to timing errors.

Figure 3:
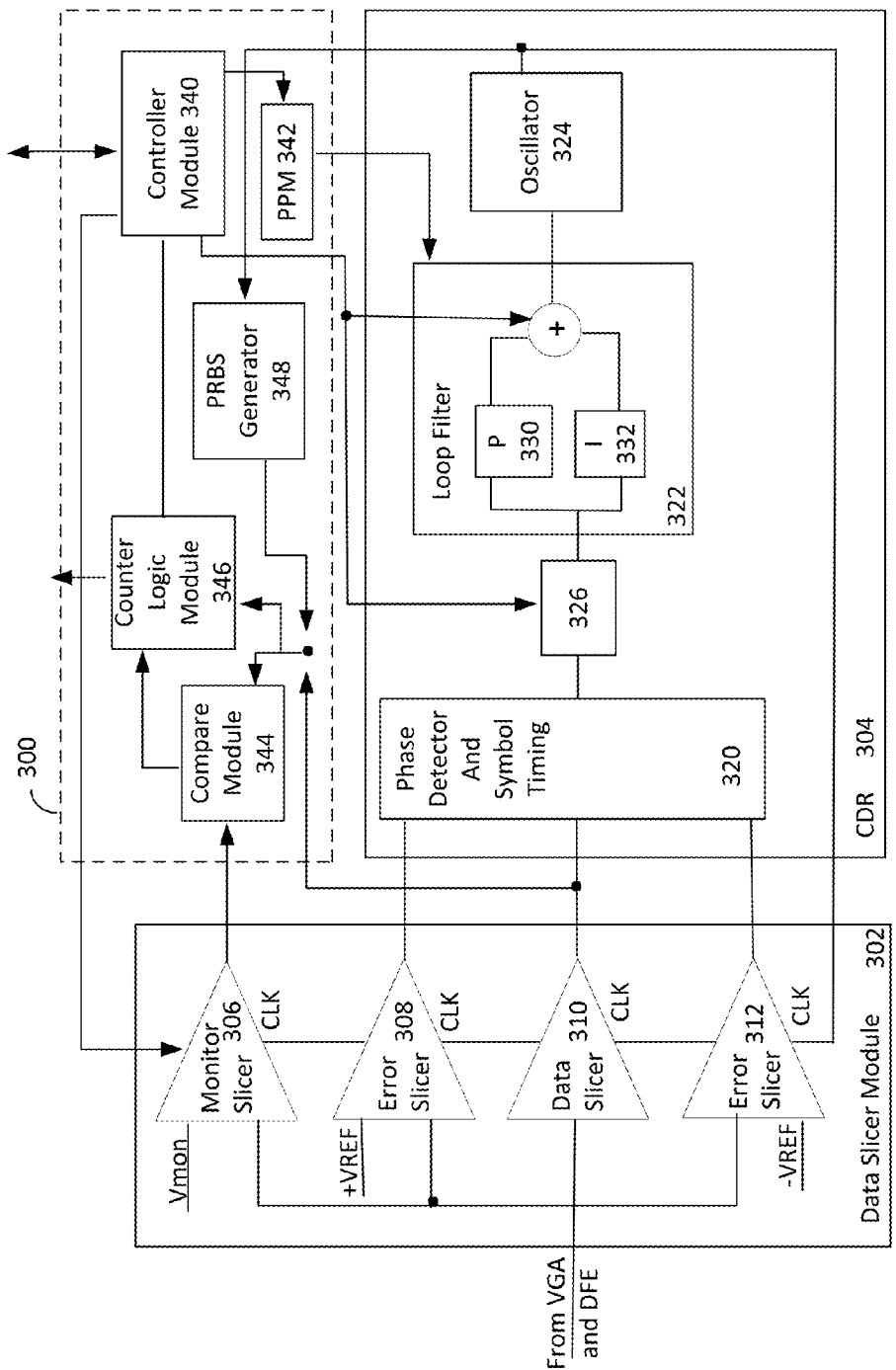
FIG. 3 illustrates eye measurement circuitry, a data slicer module and an embodiment of a clock and data recovery CDR module consistent with the present disclosure.

FIG. 3 illustrates eye measurement circuitry 300, a data slicer module 302 and an embodiment of a clock and data recovery CDR module 304 consistent with the present disclosure. The data slicer module 302 is an example corresponding to data slicer 116 of FIG. 1 and the CDR 304 is an example corresponding to CDR 118 of FIG. 1. The data slicer module 302 may include monitor slicer 306. The data slicer module 302 includes a positive error slicer 308, a data slicer 310 and a negative error slicer 312. The slicers 306, 308, 310, 312 are configured to discretize and sample the amplified and equalized signal received from, e.g., DFE 114. The slicers 306, 308, 310 are configured to sample at a recovered clock frequency provided by CDR 304 and to output a logic high (or low) when the sampled input signal is above (or below) a reference input value. The negative reference error slicer 312 is configured to sample at the recovered clock frequency and to output a logic high (or low) when the sampled input signal is below (or above) the negative error reference input value. The output of the data slicers 306, 308, 310, 312 is provided to CDR 304.

CDR 304 may include phase detector and symbol timing module 320, a loop filter 322, an oscillator 324 and coupling circuitry 326. During normal operation, phase detector and symbol timing module 320 is configured to receive output signals from data slicer 310 ("receiver bit stream") and the error slicers 308, 312, to perform phase detection and symbol timing functions on the received signals. Phase detector and symbol timing module is configured to provide a corresponding output to loop filter 322 via coupling circuitry 326. The loop filter is configured to adjust a frequency of oscillator 324 so that a clock signal may be recovered and "lock" obtained on the received bit stream. Coupling circuitry 326 may include, but is not limited to, a switch (analog or digital), and/or a register configured to store digital information. Coupling circuitry 326 is one example of circuitry that may be included on-die configured for design-for-test and/or may be included for general operation of CDR 304.

For example, phase detector and symbol timing module 320 may be configured to implement a phase detector and symbol timing method such as Qureshi that is configured to utilize three consecutive samples of data (e.g., from data slicer 310) and error (e.g., from error slicers 308 and 312) and to adjust an output of the phase detector and symbol timing module 320 and ultimately the input to the oscillator 324 based, at least in part, on the three consecutive samples. In another example, phase detector and symbol timing module 320 may be configured to implement another detector and symbol timing module such as Mueller and Muller. Mueller and Muller is a one-sample-per symbol decision-directed method where "decision-directed" corresponds to the fact that in the Mueller and Muller method, the phase detector and symbol timing module 320 may be configured to estimate a bit in the transmitted bit stream in and typically does so based on a current sample, e.g., an output of data slicer 310. Other phase detection and symbol timing methods may be utilized and it may be appreciated that operation of system and method consistent with the present disclosure is independent of the specific phase detection and symbol timing module used.

Loop filter 322 is configured to low pass filter (e.g., average) the signal received from the phase detector and symbol timing module 320. For example, loop filter 322 may include a proportional stage 330 and an integrator stage 332, as described herein. The filtered signal may then be provided to oscillator 324 and is configured to adjust an output frequency of the oscillator 324 where the output of oscillator 324 corresponds to a recovered clock signal provided to data slicer module 302. When locked, the recovered clock signal corresponds to a receiver clock signal associated with the receiver bit stream output of the data slicer module 302. In some embodiments, oscillator 324 may be a voltage controlled oscillator (VCO). In some embodiments, oscillator 324 may be a digital controlled oscillator (DCO). The output of oscillator 324 is fed back to the data slicer module 302 and is configured to synchronize the recovered clock and data signals to the receiver clock signal. The output of data slicer 310 may then correspond to bit stream out in FIG. 1 and the outputs of the error slicers 308, 312 may the correspond to error out in FIG. 1.

Eye measurement circuitry 300 includes a controller module 340, a margining input module 342, a compare module 344 and a counter logic module 346. Eye measurement circuitry 300 may include a PRBS (pseudo-random bit sequence) generator 348. The margining input module 342, the compare module 344, the counter logic module 346 and the PRBS generator 348 may be included and/or may exist on-die independent of whether eye measurement and margining is implemented as described herein. Although illustrated as individual modules, one or more of the modules may be combined into a single module, consistent with the present disclosure.

The controller module 340 is configured to manage eye width measurement and margining. The controller module 340 may be configured to provide measurement data to, e.g., a computing device including a user interface, so that tests can be initiated and results communicated. The controller module 340 is configured to provide commands to margining input module 342, counter logic module 346, PRBS generator 348 (if active) and coupling circuitry 326. The controller module 340 may be configured to receive an indication that a BER has been met in order to initiate an eye width measurement process as described herein. In some embodiments, controller module 340 may be included on-die. In some embodiments, controller module 340 may be off-die and coupled to on-die elements of the eye measurement circuitry 300 and/or CDR 304 for performing eye margining, as described herein.

Depending on a test configuration, PRBS generator 348 may or may not be utilized for eye width measurement. When PRBS generator 348 is utilized, controller module 340 may be configured to provide test sequence selection data to PRBS generator 348 so that it may generate the correct pseudo-random bit sequence for the eye width measurement process. One of a plurality of PRBS sequences may be utilized for testing purposes. Such sequences may be utilized for determining BER as well as eye width measurement and margining consistent with the present disclosure. Providing test sequence selection data is configured to allow the PRBS generator 348 to generate a same PRBS sequence as was transmitted, e.g., bit stream in to transmitter Tx 102 in FIG. 1.

Controller module 340 may be configured to provide margining input selection data to margining input module 342. For example, as described herein, margining input may be in the range of about 1000 PPM to about 10,000 PPM. Controller module 340 may thus be configured to select a specific margining input, e.g., 5000 PPM. The margining input may be constant for at least a portion of a test sequence (e.g., eye width measurement). For example, the specific margining input may be set by a user communicating with controller module 340 and may correspond to a desired resolution of the eye width measurements as described herein. In some embodiments, the desired resolution may vary based, at least in part, on a distance from the edge of the eye, as described herein. In another example, controller module 340 may be configured to select the specific margining input based, at least in part, on a bit rate of bit stream in, e.g., 10 Gb/sec, and/or a desired resolution of the eye width measurement.

Controller module 340 may be configured to adjust Vmon, the reference input for monitor slicer 306. In some embodiments, the monitor slicer 306 may be configured to facilitate eye width measurements at zero as well as amplitudes other than zero by selecting Vmon. For example, Vmon may be adjusted from zero to (full eye height+a margin). Thus, controller module 340 may be configured to adjust Vmon in order to set the amplitude at which eye width may be determined, as described herein.

Controller module 340 may be configured to receive an indication that a desired BER has been achieved. Controller module 340 may be configured to initiate an eye width measurement based, at least in part, on this indication. A test bit stream in (e.g., PRBS) may be provided as input to transmitter 102 and CDR 304 may be allowed to synchronize recovered clock signal to the receiver clock signal. As used herein, during eye width measurement and/or eye characterization, the clock signal output from the oscillator 324 is termed a margining clock signal. Thus, the margining clock signal may be synchronized to the receiver clock signal when the recovered clock signal is synchronized to the receiver clock signal.

Controller module 340 may be configured to decouple phase detector and symbol timing module 320 and loop filter 322 via coupling circuitry 326 in response to the synchronizing. For example, coupling circuitry 326 may be a switch and controller module 340 may be configured to command coupling circuitry 326 to open. Controller module 340 may then command loop filter 322 to set a gain of proportional stage 330 to zero and to freeze any gains associated with integrator stage 322 at their current values. The current values of the gains associated with the integrator stage 322 correspond to oscillator 324 current output frequency (e.g., margining clock frequency). Thus, since the recovered clock signal and the receiver clock signal are synchronized when the phase detector and symbol timing module 320 and loop filter 322 are decoupled, the current integrator values correspond to recovered clock signal synchronized to receiver clock signal.

Controller module 340 may then be configured to trigger margining input module 342 to apply the margining input to loop filter 322. Controller module 340 may be further configured to reset counter logic module 346 and to enable counter logic module 346 to start counting. The effect of the added margining input is to cause a frequency difference between the output of oscillator 324 (e.g., margining clock) and the received signal clock. Because of the frequency difference, a phase difference begins to accumulate. This phase difference increases by one phase difference increment with each clock cycle (e.g., unit interval, symbol interval). By counting the symbol intervals beginning with the initial application of the phase difference until an error is detected, a portion of the eye width from the center to the right edge, e.g., portion 206 may be determined. Closing the loop and allowing the system to stabilize (e.g., allowing the margining clock signal to synchronize to the receiver clock signal), followed by applying a negative margining input and repeating the process may allow a portion of the eye width from the center to the left edge, e.g., portion 208 to be determined. The process may be repeated multiple times in order to improve statistical characteristics. The process may be similarly repeated with adjustments to Vmon between test sequences in order to characterize the eye pattern (e.g., above and/or below zero).

In some embodiments, controller 340 may be configured to measure an entire eye width (rather than one half of the eye width) in one scan. For example, controller 340 may be configured to trigger margining input module 342 to apply the margining input to loop filter 322. Controller 340 may then be configured to monitor compare module 344 until an error is detected. Controller 340 may then be configured to reset counter logic module 346, to enable counter logic module 346 to start counting and to invert the margining input applied by margining input module 342 to loop filter 322. The count when an error is detected may then correspond to the entire eye width, e.g., count*$\Delta T$. Thus, the entire eye width may be determined in one scan.

The margining input may have units of PPM (parts per million) typically used to quantify clock accuracy. In some embodiments, the margining input may be in the range of about 1000 PPM to about 10,000 PPM. The margining input may be selected to be at least one order of magnitude greater than typical clock accuracy. The phase difference increment may be determined as follows. Assume the output frequency of oscillator 324 is f when the loop is opened between phase detector and symbol timing module 320 and loop filter 322. Thus, f corresponds to the recovered clock signal frequency, the margining clock signal frequency (when the loop is opened prior to applying the margining input) and the receiver clock signal frequency. For a margining input of m PPM, the margining clock signal frequency may shift by $\Delta f = mPPM*f = m*f*10^{-6}$ yielding a margining clock frequency of $f \pm \Delta f$, with the plus or minus related to whether the eye width is being swept to the left 208 or the right 206. The phase difference increment may be determined as $\Delta T = (1/f) - (1/(f \pm \Delta f))$ which, after some algebraic manipulation and recognition that m PPM is much less than one, yields $\Delta T = \pm mPPM/f$. Thus, for a 10 Gb/sec bit stream and a margining input of 5000 PPM, the phase difference increment may be determined to be 0.5 picoseconds which corresponds to a minimum resolution of the eye width margining for this example. Thus, a margining input may be selected to achieve a desired resolution based on a data rate.

In some embodiments, a plurality of margining inputs may be applied during a test sequence. For example, a relatively larger margining input may be applied initially configured to provide a relatively larger phase difference increment away from the edge of the eye (e.g., near the ideal sampling instance). A relatively smaller margining input may then be applied configured to provide a smaller phase difference increment and therefore finer resolution closer to the edge of the eye width. The test sequence may then be performed relatively more quickly. Thus, in these embodiments, both coarse and fine resolution may be provided by adjusting the margining input. Determination of eye width may then include each of a plurality of counts of clock cycles corresponding to a respective one of the plurality of margining inputs.

Counter logic module 346 is configured to count a number of clock cycles until an error is detected as described herein. In some embodiments, counter logic module 346 may be coupled to PRBS generator 348 and may thus count clock cycles based on the PRBS bit stream. In some embodiments, e.g., where the PRBS generator 348 is not used, counter logic module 346 may be configured to count clock cycles based on an output from data slicer module 302, e.g., data slicer 310 output corresponding to the receiver bit stream. For example, counter logic module 346 may be configured to start counting in response to a first transition detected after being enabled by controller module 340. In some embodiments, counter logic module 346 is configured to continue counting until an error is detected by, e.g., compare module 344. In some embodiments, counter logic module 346 may stop counting in response to a command from controller module 340, e.g., if an eye width measurement has timed out without an error being detected. In some embodiments, counter logic module 346 may be configured to capture a current count when an error is detected and to continue counting, as described herein.

In some embodiments, counter logic module 346 may include circuitry configured to compensate for relatively short duration bit sequences that do not include a transition. Such circuitry is configured to compensate a count value for a number of transitions in a bit stream until the error occurred.

Compare module 344 is configured to compare two bit streams configured to detect an error (e.g., a difference between the two bit streams). Compare module 344 is configured to provide an output signal to counter logic module 346 when an error is detected. Comparison of the two bit streams is configured to detect when an eye edge has been reached during an eye measurement as described herein. The specific bit streams scanned may depend on characteristics of the particular eye width measurement process. In the embodiments that include using the PRBS generator 348, the compare module 344 may be configured to compare the PRBS bit stream output from the PRBS generator 348 and a bit stream output from monitor slicer 306 ("monitor bit stream") or a bit stream output from data slicer 310, e.g., receiver bit stream. For example, the receiver bit stream may be compared to the PRBS bit stream when measuring eye width at or near zero. In another example, the monitor bit stream may be compared to the PRBS bit stream when measuring eye width at a level set by Vmon configured to characterize the eye at any level, the level set by Vmon. The monitor bit stream may correspond to the receiver bit stream when Vmon is equal to zero. In the embodiments where the PRBS generator 348 is not used, the compare module 344 may be configured to compare the monitor bit stream and the receiver bit stream. In these embodiments, Vmon of monitor slicer 306 may be adjusted to facilitate eye width measurement, as will be described in more detail below. Selection of the two inputs to compare may be performed by controller module 340, e.g., in response to a user command.

Thus, eye measurement circuitry 302 may be configured to implement a variety of eye width measurements including eye diagram characterization. The measurements may be performed by circuitry that typically exists on-die including circuitry required for operation of e.g., CDR 304 as well as circuitry configured for design for test and/or design for manufacturing. The eye width measurements may be based on a PRBS bit stream or may be performed using an unknown bit stream, e.g., actual data.

FIGS. 4A and 4B illustrate examples of waveforms generated during eye margin characterizations performed using a method consistent with the present disclosure. The left eye margin 208 may be characterized as illustrated FIG. 4A in plot 402. A received bit stream is illustrated by a simplified eye margin waveform 404. A recovered clock signal corresponding to the received clock signal is illustrated by waveform 406. A margining clock signal is illustrated by waveform 408. The right eye margin 206 may be characterized as illustrated FIG. 4B in plot 422. A received bit stream is illustrated by a simplified eye margin waveform 424. A recovered clock signal corresponding to the received clock signal is illustrated by waveform 426. A margining clock signal is illustrated by waveform 428. At each start of test marker 410, 430, the respective recovered clock signal 406, 426 and the respective margining clock signal 408, 428 are in phase. As time goes on and the margining characterizations proceed, as described herein, the magnitude of the phase differences between respective recovered clock signal 406, 426 and the respective margining clock signal 408, 428 increase until an error is detected 412, 432.

A left eye margin 414 and a right eye margin 434 may then be determined based, at least in part, on a count of clock cycles (e.g. unit intervals) from the start of test marker 410, 430 to the first bit error 412, 432 and the phase difference increment $\Delta T$ (e.g., eye margin=number of clock cycles * phase difference increment). In some embodiments, the count of unit intervals may be adjusted for a known number of transitions during the test time period. For example, when the bit stream is a known PRBS, the adjustment may correspond to a number of adjacent intervals that did not have a bit transition between them. An eye margin characterization sequence, as described herein, may be repeated a number of times and statistical averages may be obtained for the measured eye width.

In some embodiments, each characterization sequence may include a maximum allowed time to detect an error and/or a maximum allowed time to recapture (e.g., between sequential tests). Both parameters are configured to provide a limit to a testing trial if, for example, the received bit stream does not have transitions or after a characterization sequence has completed, the margining input removed and the loop closed, the CDR is unable to recapture symbol timing. Such limits may be useful for limiting total test time in a production environment.

For example, for 0.5 picosecond resolution, a margining input of 5000 PPM and a 10 GB/second data rate, a duration of a full eye width scan may be 100 picoseconds (50 picoseconds left and 50 picoseconds right). A scan time may then equal 100 picoseconds divided by 0.5 picoseconds, e.g., a 20 nanosecond scan time to sweep the full eye width. Assuming a duration of a CDR re-lock of about 50 nanoseconds when the receiver is close to convergence, a likely maximum time for detecting an error and then re-synching would about 70 nanoseconds. If the number of trials desired is on the order of about $10^7$ to about $10^8$, a duration of the entire test including the number of trials corresponds to about 7 seconds (70 nsec× $10^8$). Typically, the duration of a single scan will be less than 20 nanoseconds, so 7 seconds will seldom be reached. For example, the parameters affecting the scan time are open-loop eye-scan phase time and closed loop re-train phase time (which may be impacted by CDR bandwidth).

In some embodiments, a system and method consistent with the present disclosure may be utilized to emulate a specific phase shift and to then dwell at that phase shift until a phase noise exceeds a threshold. Phase noise is typically proportional to a square root of dwell time. The specific phase shift may be achieved by applying the margining input as described herein and counting a number of unit intervals that correspond to the specific phase shift divided by the phase difference increment. Once the desired phase shift is achieved, the margining input may be removed and the system may be configured to dwell at the specific phase shift for M clock cycles. During the dwell time, the eye pattern may be characterized as described herein. Thus, effects of phase noise may be investigated using a method and system consistent with the present disclosure.

Figure 5A:
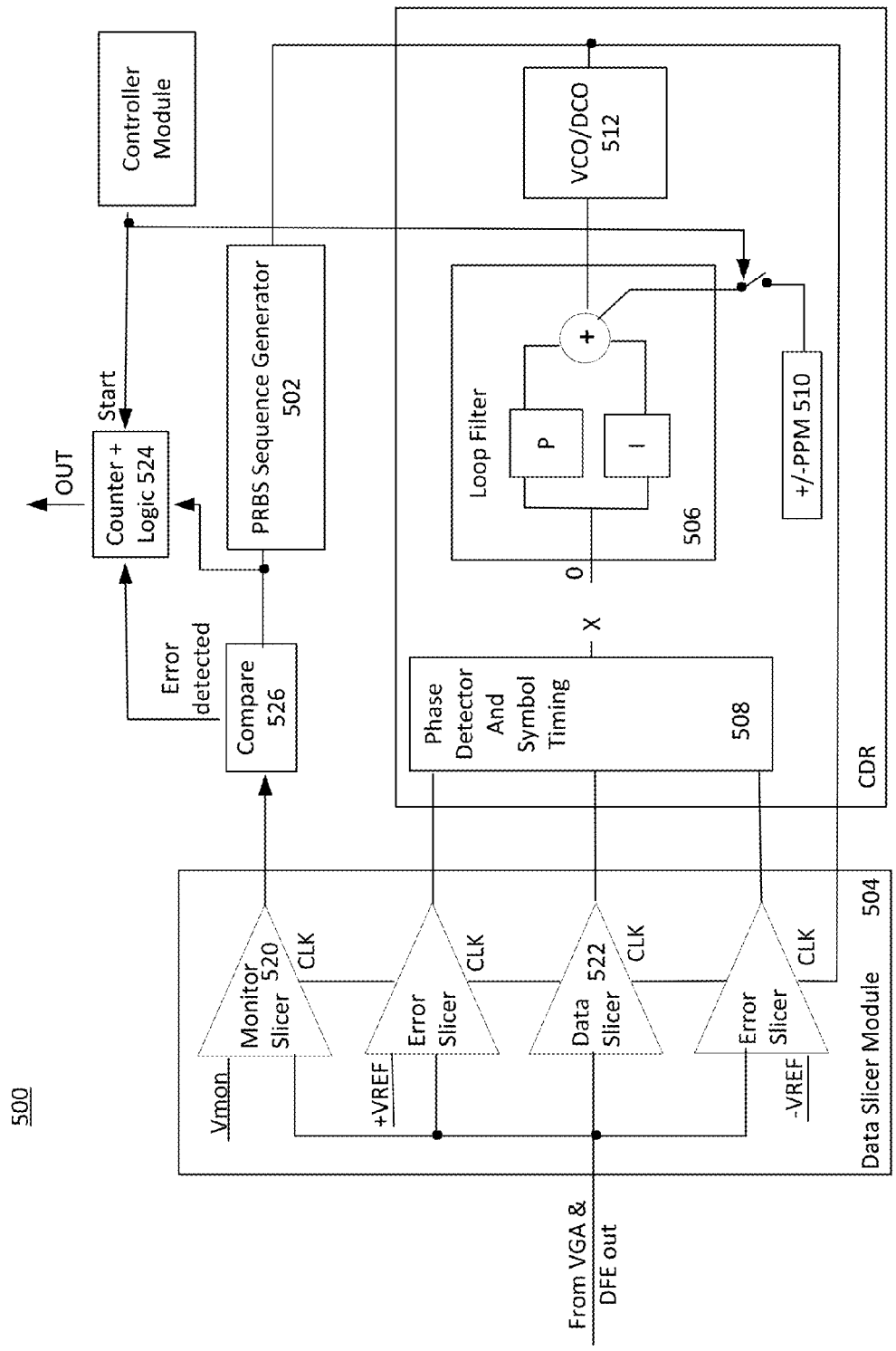
FIG. 5A illustrates one example of an eye measurement system configured to characterize the eye margin consistent with the present disclosure.

FIG. 5A illustrates one example of an eye measurement system 500 configured to characterize the eye margin, as described herein. In this example, a known PRBS (pseudo-random binary sequence) corresponds to the bit stream in at the input to the transmitter 102. The PRBS may also be generated in the receiver by PRBS generator 502 and synchronized to the received PRBS from the transmitter. Continuing with this example, the received PRBS is equalized and amplified by, e.g., equalizer 110, VGA 112 and DEF 114 of FIG. 1, and the result is provided to a data slicer module 504. After the recovered clock signal (output from oscillator 512)

is synchronized to a receiver clock signal included in the receiver bit stream (output from slicer module 504, e.g., from data slicer 522), a loop filter 506 is decoupled from phase detector and symbol timing module 508. A margining input PPM 510 may then be applied to the output of the loop filter 506, as described herein. As a result, a frequency output of VCO/DCO 512 (margining clock signal) is configured to sweep the eye width, as described herein.

An output of monitor slicer 520 (monitor bit stream) or data slicer 522 (receiver bit stream) may be provided to compare module 526 along with an output of PRBS sequence generator 502 (PRBS bit stream). The counter logic module 524 may be configured to count UIs (unit intervals, e.g., clock cycles) based on the PRBS bit stream from a start measurement command to at least an error being detected. A first error may be detected by compare module 526 when the monitor bit stream and/or receiver bit stream and the PRBS bit stream do not agree. The receiver bit stream may be utilized with the PRBS bit stream to characterize the eye width near zero. Amplitudes of the eye opening may be characterized using monitor bit stream and the PRBS bit stream. An effect of a non-zero Vmon is to shift by Vmon a threshold where the output of the monitor slicer 520 transitions from high to low or low to high. By sweeping the output of VCO/DCO 512 with Vmon nonzero, provides characterization of the eye width shifted up by +Vmon or down by −Vmon may be provided. In this manner, the entire eye diagram may be characterized.

Figure 5B:
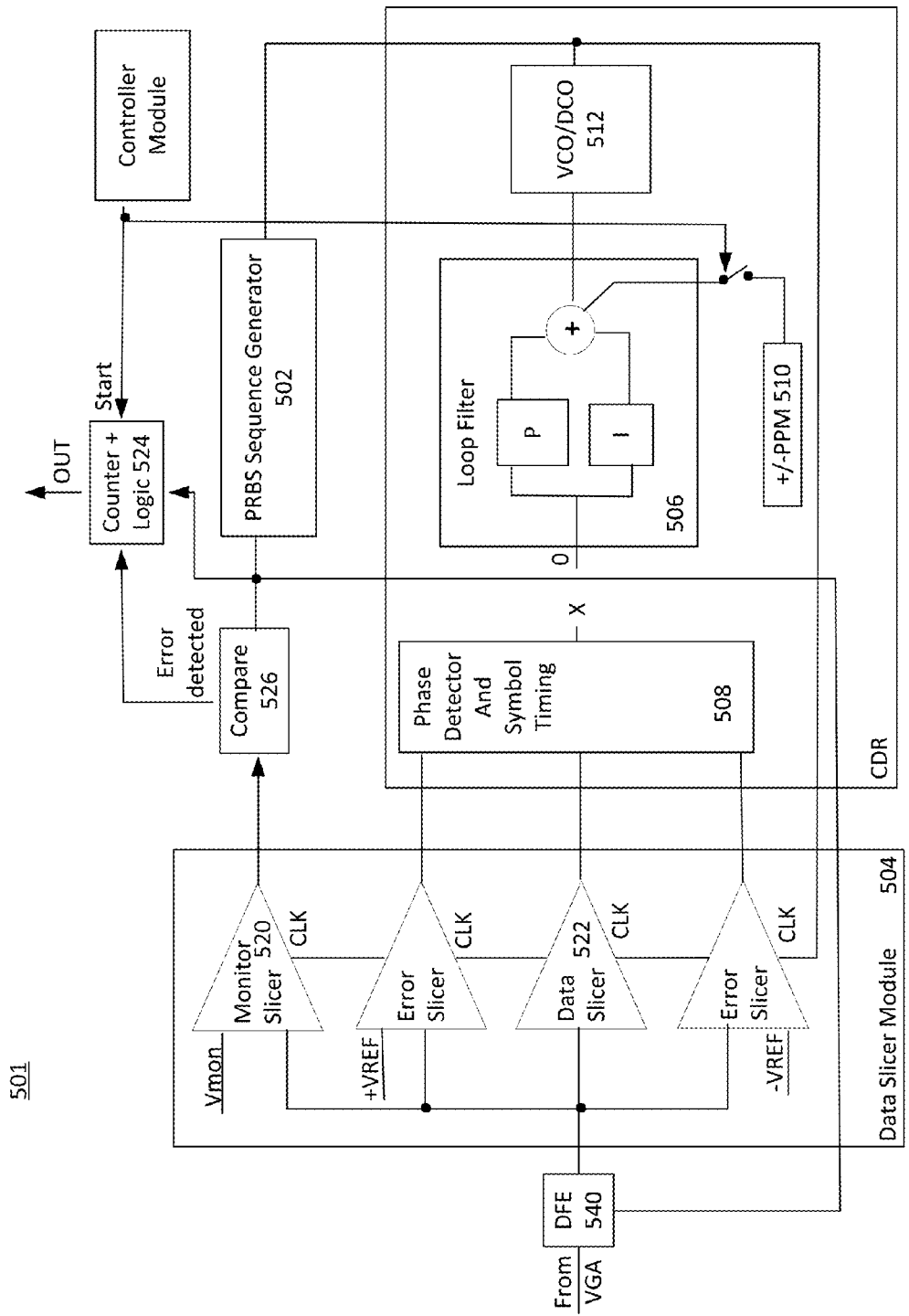
FIG. 5B illustrates another example of an eye measurement system configured to characterize the eye margin consistent with the present disclosure.

FIG. 5B illustrates another example of an eye measurement system 500' configured to characterize the eye margin, as described herein. This example is similar to test circuit 500 except that rather than the receiver bit stream being fed back to DFE 540 (corresponding to DFE 114 of FIG. 1), the PRBS bit stream generated by the receiver PRBS generator 502 is provided to the DFE 540. In this example, by feeding back the receiver PRBS bit stream, rather than the receiver bit stream, even if a system has sampling errors, such errors will not propagate through the DFE and close the eye and/or create error multiplication. By avoiding error multiplication, an eye characterization test may extend beyond a first error. Thus, the characterization test time may be shortened, more statistical data may be harvested and error probability distributions may be generated, as desired. Thus, more information may be gathered and learned related to a system's timing jitter and/or behavior. After the eye characterization test is performed, statistical methods may be used for, e.g., further analysis, eye-width probability distribution generation, eye margining and/or a relation between eye margin and DPM (Device Failures per Million parts shipped).

Figure 6:
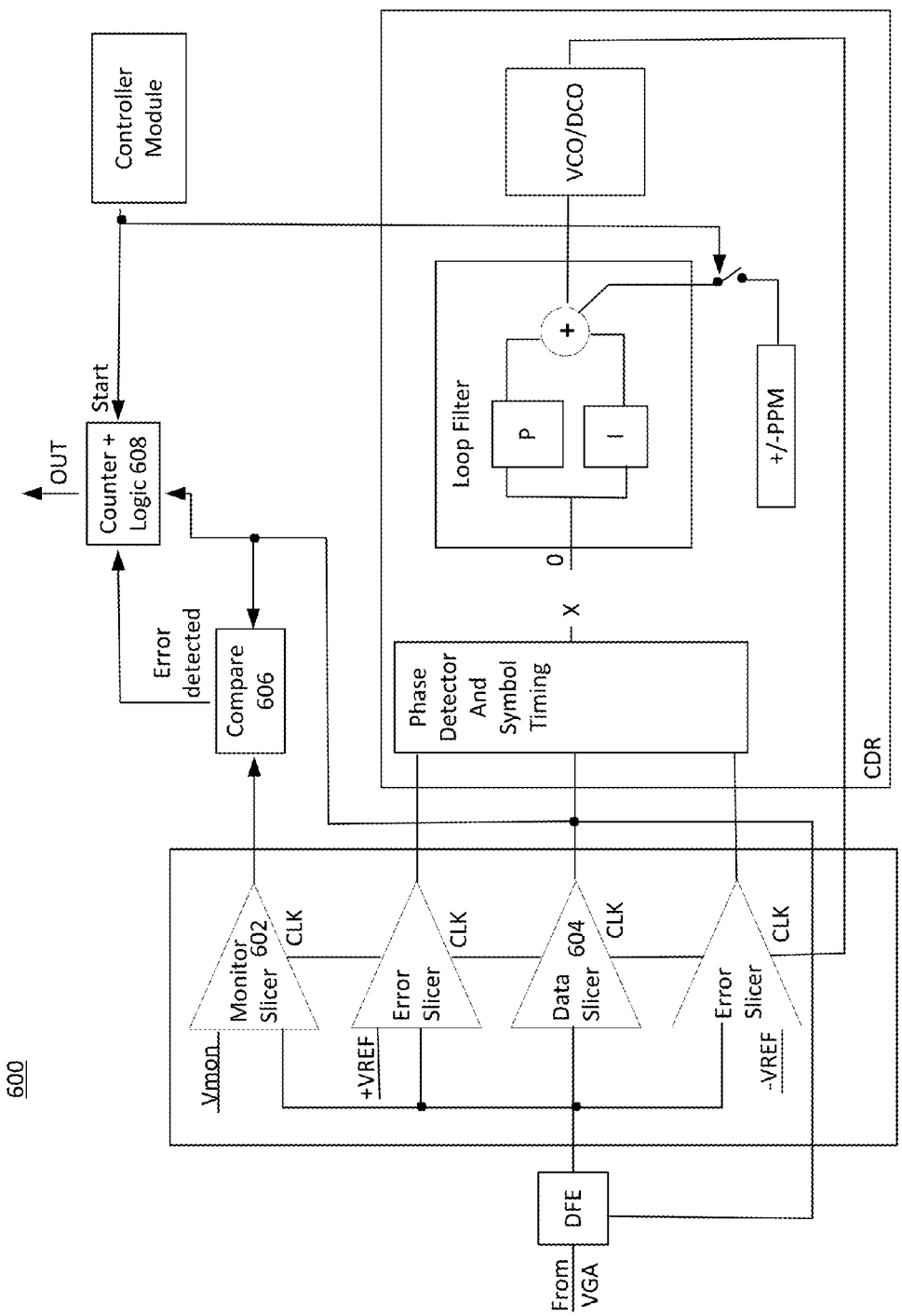
FIG. 6 illustrates another example of an eye measurement system configured to characterize the eye margin consistent with the present disclosure.

FIG. 6 illustrates another example of an eye measurement system 600 configured to characterize the eye margin as described herein. In this example, the transmitted bit stream is not known to be a PRBS sequence and may be arbitrary, e.g., may include actual data. In this example, errors may be detected by comparing a monitor bit stream to a receiver bit stream when the monitor slicer's reference input Vmon is set slightly higher or lower than the data slicer's reference. The comparison may be performed by compare module 606. If the receiver bit stream and monitor bit stream agree, then no error may be detected. If the receiver bit stream and monitor bit stream do not agree, an error may be detected and an edge of the eye is reached. Thus, an eye diagram may be characterized using a data sequence that is not known a priori. By adjusting Vmon and repeating an eye width characterization, as described herein, an eye width may be determined at any threshold set by Vmon. In other words, when monitor bit stream and the receiver bit stream disagree an output of counter logic module 608 multiplied by the phase difference increment may correspond to eye width at amplitude Vmon. In some embodiments, the eye width characterization may be repeated several times and the results averaged. Such averaging is configured to reduce the dependence of the result on the particular data sequence received and to reduce effects on the eye width characterization due to noise and ill-statistics of the data sequence. In this manner, the eye width may be characterized using an arbitrary input.

Figure 7:
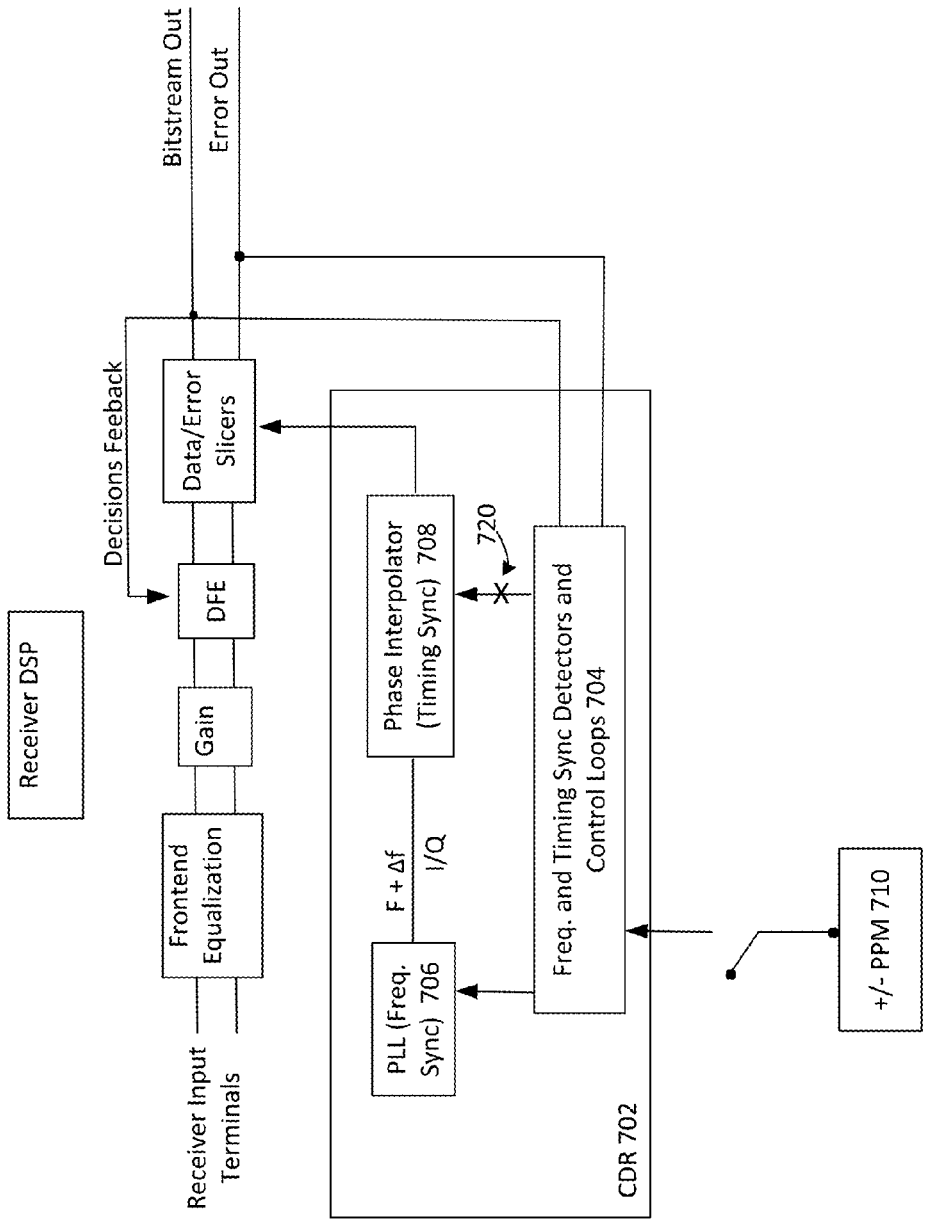
FIG. 7 illustrates another embodiment of a system for eye width measurements and margining consistent with the present disclosure.

FIG. 7 illustrates another embodiment of a system 700 for eye width measurements and margining consistent with the present disclosure. Rather than a VCO or DCO based CDR, CDR module 702 corresponds to a phase interpolator (PI) based CDR module. CDR 702 includes a frequency and timing synchronization detectors and control loops module 704, a phase locked loop 706 configured to provide frequency synchronization with a received signal and a phase interpolator 708 configured to provide timing synchronization. The frequency and timing synchronization detectors and control loops module 704 and PLL 706 are configured to lock reference sine and cosine components (e.g., in-phase and quadrature (I/Q) to the received clock and data signal (e.g., received bit stream) frequency. The reference I/Q is configured to drive phase interpolator 708. Once frequency lock (e.g., recovered clock frequency corresponds to the receiver clock frequency) is obtained and frequency tracking achieved, the phase no longer drifts across the eye and the sampling clock reaches a nearly constant phase shift from approximately a middle of the eye. A second loop included in frequency and timing synchronization detectors and control loops module 704 and operating using a phase detector or symbol timing detector may lock to the correct sampling phase by modulating the phase interpolator 708 control signals (e.g., shifting phase up or down until proper alignment of the sampling clock to the middle of the eye diagram is obtained).

For example, to implement eye width measurement and/or eye diagram characterization using CDR 702, the phase loop should be decoupled at, e.g., point 720, configured to "freeze" the phase loop when entering eye-scan mode. A constant margining input PPM 710 may then be added to the frequency loop so PLL 706 now tracks F(ref)+delta (where Fref is obtained by a frequency detector on the incoming signal).

In some embodiments, a PI-based CDR may operate using a reference crystal instead of locking onto the frequency of the incoming data. In these embodiments, the phase loop is configured to add or subtract phase at a certain rate in order to track a residual frequency offset between the reference and the incoming signal frequency. In order to perform eye scan in these embodiments, rather than freezing the frequency loop, an amount of phase added by the PI phase loop may be adjusted. Such adjusting is configured to introduce some of the frequency difference between the sampling clock and incoming data signal. The phase detector of the phase loop may also be frozen while the eye width measurement is performed which will have the effect of eye scan.

For example, if the Fref frequency deviates by $\Delta F$ from the data frequency, the phase loop is configured to add mod $(2\pi\Delta Ft, 2\pi)$ phase to maintain frequency lock to the incoming data. If the added phase is reduced at each given time, a different frequency (PPM) may appear and effectively scan the eye. Thus, a method and system consistent with the present disclosure may be utilized in both an oscillator-based (e.g., VCO/DCO-based) CDRs as well as PI-based CDRs, as described herein.

Figure 8:
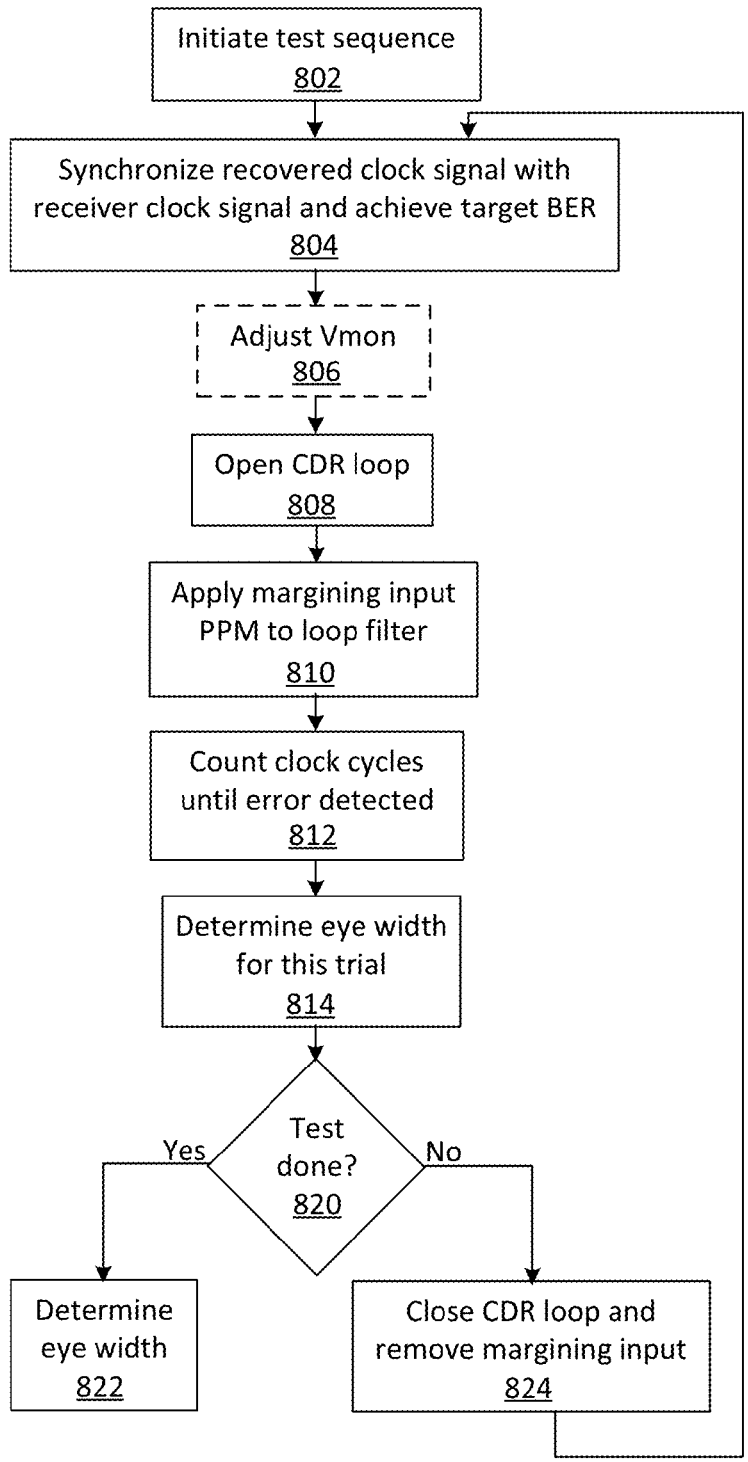
FIG. 8 illustrates a flowchart of exemplary operations consistent with an embodiment of the present disclosure.

FIG. 8 illustrates a flowchart 800 of exemplary operations consistent with an embodiment of the present disclosure. The operations may be performed, for example, by any of example apparatuses 500, 500', 600. In particular, flowchart 800 depicts exemplary operations configured to characterize an eye width and/or an eye diagram.

Operations of flow chart 800 may begin 802 with initiating a test sequence. For example, transmitter 102 and receiver 106 may be coupled, powered up and a known PRBS sequence or another sequence may be applied to transmitter 102. The communication system 100 may then be allowed to stabilize. Operation 804 may include synchronizing the recovered clock signal to the receiver clock signal and achieving a target BER. The receiver clock signal may be included in a receiver bit stream. A CDR, e.g., CDR 304 may be configured to synchronize a recovered clock signal to the receiver clock signal based, at least in part, on the receiver bit stream. In some embodiments, Vmon may be adjusted at operation 806. Vmon may be adjusted to shift an eye width measurement up or down, e.g., to characterize the eye diagram and/or to characterize eye width for an unknown bit stream.

Operation 808 includes opening a CDR loop. For example, phase detector and symbol timing module may be decoupled from a loop filter at operation 808. At least some loop filter parameters may be frozen at their values just prior to opening the loop. An oscillator coupled to the loop filter may then be configured to oscillate at a same frequency as just prior to opening the loop, e.g., the margining clock frequency is synchronized to the receiver clock frequency. A margining input may be applied to the loop filter at operation 810. The margining input is configured to shift the margining clock frequency to provide a frequency delta between a receiver clock signal frequency and the margining clock frequency related to a phase difference increment. A counter may be initiated, counting may be begin and may continue at least until an error has been detected at operation 812. An eye width for a current trial may be determined at operation 814.

Whether the test is done may be determined at operation 820. For example, whether the test is done may be determined based on a number of trials. In another example, whether the test is done may be determined based on a duration of the test. If the test is done, an eye width may be determined at operation 822. For example, the eye width may be determined by averaging the eye widths determined for each trial. If the test is not done, the CDR loop may be closed and the margining input removed at operation 824. Program flow may then proceed to operation 804 synchronizing the recovered clock signal to the receiver clock signal and achieving a target BER.

Thus, an eye width may be determined and/or an eye diagram may be characterized by allowing a margining clock signal to synchronize with a receiver clock signal and a BER to be achieved then opening the loop in a CDR and injecting in margining input configured to sweep the eye width. A number of trials may be performed and the resulting eye width measurements may be averaged, for example, to determine the eye width. The margining input may be selected to provide a desired resolution in the eye width measurement.

While FIG. 8 illustrates various operations according one embodiment, it is to be understood that not all of the operations depicted in FIG. 8 are necessary for other embodiments. Indeed, it is fully contemplated herein that in other embodiments of the present disclosure, the operations depicted in FIG. 8 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

Any of the operations described herein may be implemented in a system that includes one or more storage mediums having stored thereon, individually or in combination, instructions that when executed by one or more processors perform the methods. Here, the processor may include, for example, a CPU, a logic state machine, a sequencer and/or other programmable circuitry. Also, it is intended that operations described herein may be distributed across a plurality of physical devices, such as processing structures at more than one different physical locations. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), magnetic or optical cards, or any type of media suitable for storing electronic instructions. Other embodiments may be implemented as software modules executed by a programmable control device. The storage medium may be non-transitory.

As used in any embodiment herein, the term "module" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The modules may, collectively or individually, be embodied as circuitry that forms part of a larger system, for example, an integrated circuit (IC), system on-chip (SoC), desktop computers, laptop computers, tablet computers, servers, smart phones, etc.

Thus, a system and method consistent with the present disclosure are configured to provide eye width measurement and/or eye width characterization for a communication system. The measurement and/or characterization may be done on chip, using existing design for test functionality. A system and method are configured to provide fine resolution based on a data rate of a bit stream and the margining input. The system and method may be used for receiver clock and data recovery (CDR) circuits that employ voltage controlled oscillators (VCOs) and/or digitally controlled oscillators (DCOs). The system and method may be further applied to phase interpolation (PI) based CDR circuits.

According to one aspect there is provided an apparatus. The apparatus may include a controller module configured to decouple a phase detector from a loop filter of a receiver under test in response to synchronizing a margining clock signal to a receiver clock signal at a receiver clock signal frequency, the margining clock signal generated by an oscillator coupled to the loop filter; a margining input module configured to apply a margining input to the loop filter, the margining input configured to shift a frequency of the margining clock signal by a constant amount related to the margining input; a compare module configured to compare a first bit stream and a second bit stream, the comparing configured to detect an error, the first bit stream related to a transmitted bit stream received by the receiver under test; and a counter logic module configured to count cycles of the receiver clock signal or the margining clock signal, wherein an eye width associated with the receiver under test is related to the margining input, the frequency of the receiver clock signal and a count of clock cycles when an error is detected.

Another example apparatus includes the forgoing components and further includes a pseudo-random bit sequence (PRBS) generator configured to generate a pseudo-random bit sequence synchronized to the margining clock signal.

Another example apparatus includes the forgoing components and the first bit stream corresponds to a receiver bit stream and the second bit stream corresponds to the pseudo-random bit sequence.

Another example apparatus includes the forgoing components and the first bit stream is a receiver bit stream and the second bit stream is related to the first bit stream.

Another example apparatus includes the forgoing components and the margining input corresponds to a voltage and the oscillator is a voltage controlled oscillator.

Another example apparatus includes the forgoing components and the margining input corresponds to a digital value and the oscillator is a digital controlled oscillator.

According to another aspect there is provided a method. The method may include decoupling a phase detector from a loop filter of a receiver under test in response to synchronizing a margining clock signal to a receiver clock signal at a receiver clock signal frequency; applying a margining input to the loop filter, the margining input configured to shift a frequency of the margining clock signal by a constant amount related to the margining input; comparing a first bit stream and a second bit stream, the first bit stream related to a transmitted bit stream received by the receiver under test, the comparing configured to detect an error; and counting cycles of the receiver clock signal or the margining clock signal, wherein an eye width associated with the receiver under test is related to the margining input, the frequency of the receiver clock signal and a count of clock cycles when the error is detected.

Another example method includes the forgoing operations and further includes generating a pseudo-random bit sequence synchronized to the margining clock signal.

Another example method includes the forgoing operations and further includes generating the first bit stream based, at least in part, on the margining clock signal.

Another example method includes the forgoing operations and further includes removing the margining input from the loop filter; recoupling the phase detector and the loop filter; delaying for a time interval configured to allow the margining clock signal and the receiver clock signal to synchronize; and halting the test if the margining clock signal and the receiver clock signal are not synchronized at the end of the time interval.

Another example method includes the forgoing operations and further includes removing the margining input from the loop filter after a time interval, the time interval corresponding to a phase shift between the receiver clock signal and the margining clock signal; and dwelling at the phase shift for a number M of clock cycles while comparing and counting.

Another example method includes the forgoing operations and the first bit stream is a receiver bit stream and the second bit stream is related to the first bit stream.

Another example method includes the forgoing operations and the first bit stream corresponds to a receiver bit stream and the second bit stream corresponds to the pseudo-random bit sequence.

According to one aspect there is provided a receiver. The receiver may include a clock and data recovery (CDR) module comprising a phase detector, a loop filter coupled to an output of the phase detector, and an oscillator coupled to an output of the loop filter, the oscillator configured to generate a margining clock signal; a data slicer module configured to receive the margining clock signal from the CDR module, to generate a first bit stream based, at least in part, on the margining clock signal and to provide a receiver clock signal to the CDR module, the first bit stream related to a transmitted bit stream received by the receiver; and eye measurement circuitry. The eye measurement circuitry may include a controller module configured to decouple the phase detector from the loop filter in response to synchronizing the margining clock signal with the receiver clock signal at a receiver clock signal frequency; a margining input module configured to apply a margining input to the loop filter, the margining input configured to shift a frequency of the margining clock signal by a constant amount related to the margining input; a compare module configured to compare the first bit stream and a second bit stream, the comparing configured to detect an error; and a counter logic module configured to count cycles of the receiver clock signal or the margining clock signal, wherein an eye width associated with the receiver under test is related to the margining input, the frequency of the receiver clock signal and a count of clock cycles when the error is detected.

Another example receiver includes the forgoing components and the data slicer module comprises a data slicer configured to provide a receiver bit stream.

Another example receiver includes the forgoing components and the data slicer module comprises a monitor slicer configured to provide a monitor bit stream, the monitor bit stream related to a monitor slicer reference voltage configured to facilitate measuring the eye width at an amplitude corresponding to the monitor slicer reference voltage.

Another example receiver includes the forgoing components and the data slicer module comprises a monitor slicer configured to provide the second bit stream, the second bit stream related to a monitor slicer reference voltage.

Another example receiver includes the forgoing components and the eye measurement circuitry further comprises a pseudo-random bit sequence (PRBS) generator configured to generate a pseudo-random bit sequence synchronized to the margining clock signal.

Another example receiver includes the forgoing components and further includes a decision feedback equalizer coupled to the data slicer module and configured to receive the pseudo-random bit sequence.

Another example receiver includes the forgoing components and the oscillator is a voltage controlled oscillator or a digital controlled oscillator.

According to one aspect there is provided an apparatus. The apparatus may include a controller module configured to decouple a phase detector from a loop filter of a receiver under test in response to synchronizing a margining clock signal to a receiver clock signal at a receiver clock signal frequency, the margining clock signal generated by an oscillator coupled to the loop filter; a margining input module configured to apply a margining input to the loop filter, the margining input configured to shift a frequency of the margining clock signal by a constant amount related to the margining input; a compare module configured to compare a first bit stream and a second bit stream, the comparing configured to detect an error, the first bit stream related to a transmitted bit stream received by the receiver under test; and a counter logic module configured to count cycles of the receiver clock signal or the margining clock signal, wherein an eye width associated with the receiver under test is related to the margining input, the frequency of the receiver clock signal and a count of clock cycles when an error is detected.

Another example apparatus includes the forgoing components and further includes a pseudo-random bit sequence (PRBS) generator configured to generate a pseudo-random bit sequence synchronized to the margining clock signal.

Another example apparatus includes the forgoing components and the first bit stream corresponds to a receiver bit stream and the second bit stream corresponds to the pseudo-random bit sequence.

Another example apparatus includes the forgoing components and the first bit stream is a receiver bit stream and the second bit stream is related to the first bit stream.

Another example apparatus includes the forgoing components and the margining input corresponds to a voltage and the oscillator is a voltage controlled oscillator.

Another example apparatus includes the forgoing components and the margining input corresponds to a digital value and the oscillator is a digital controlled oscillator.

According to another aspect there is provided a method. The method may include decoupling a phase detector from a loop filter of a receiver under test in response to synchronizing a margining clock signal to a receiver clock signal at a receiver clock signal frequency; applying a margining input to the loop filter, the margining input configured to shift a frequency of the margining clock signal by a constant amount related to the margining input; comparing a first bit stream and a second bit stream, the first bit stream related to a transmitted bit stream received by the receiver under test, the comparing configured to detect an error; and counting cycles of the receiver clock signal or the margining clock signal, wherein an eye width associated with the receiver under test is related to the margining input, the frequency of the receiver clock signal and a count of clock cycles when the error is detected.

Another example method includes the forgoing operations and further includes generating a pseudo-random bit sequence synchronized to the margining clock signal.

Another example method includes the forgoing operations and further includes generating the first bit stream based, at least in part, on the margining clock signal.

Another example method includes the forgoing operations and further includes removing the margining input from the loop filter; recoupling the phase detector and the loop filter; delaying for a time interval configured to allow the margining clock signal and the receiver clock signal to synchronize; and halting the test if the margining clock signal and the receiver clock signal are not synchronized at the end of the time interval.

Another example method includes the forgoing operations and further includes removing the margining input from the loop filter after a time interval, the time interval corresponding to a phase shift between the receiver clock signal and the margining clock signal; and dwelling at the phase shift for a number M of clock cycles while comparing and counting.

Another example method includes the forgoing operations and the first bit stream is a receiver bit stream and the second bit stream is related to the first bit stream.

Another example method includes the forgoing operations and the first bit stream corresponds to a receiver bit stream and the second bit stream corresponds to the pseudo-random bit sequence.

According to one aspect there is provided a receiver. The receiver may include a clock and data recovery (CDR) module comprising a phase detector, a loop filter coupled to an output of the phase detector, and an oscillator coupled to an output of the loop filter, the oscillator configured to generate a margining clock signal; a data slicer module configured to receive the margining clock signal from the CDR module, to generate a first bit stream based, at least in part, on the margining clock signal and to provide a receiver clock signal to the CDR module, the first bit stream related to a transmitted bit stream received by the receiver; and eye measurement circuitry. The eye measurement circuitry may include a controller module configured to decouple the phase detector from the loop filter in response to synchronizing the margining clock signal with the receiver clock signal at a receiver clock signal frequency; a margining input module configured to apply a margining input to the loop filter, the margining input configured to shift a frequency of the margining clock signal by a constant amount related to the margining input; a compare module configured to compare the first bit stream and a second bit stream, the comparing configured to detect an error; and a counter logic module configured to count cycles of the receiver clock signal or the margining clock signal, wherein an eye width associated with the receiver under test is related to the margining input, the frequency of the receiver clock signal and a count of clock cycles when the error is detected.

Another example receiver includes the forgoing components and the data slicer module comprises a data slicer configured to provide a receiver bit stream.

Another example receiver includes the forgoing components and the data slicer module comprises a monitor slicer configured to provide a monitor bit stream, the monitor bit stream related to a monitor slicer reference voltage configured to facilitate measuring the eye width at an amplitude corresponding to the monitor slicer reference voltage.

Another example receiver includes the forgoing components and the data slicer module comprises a monitor slicer configured to provide the second bit stream, the second bit stream related to a monitor slicer reference voltage.

Another example receiver includes the forgoing components and the eye measurement circuitry further comprises a pseudo-random bit sequence (PRBS) generator configured to generate a pseudo-random bit sequence synchronized to the margining clock signal.

Another example receiver includes the forgoing components and further includes a decision feedback equalizer coupled to the data slicer module and configured to receive the pseudo-random bit sequence.

Another example receiver includes the forgoing components and the oscillator is a voltage controlled oscillator or a digital controlled oscillator.

According to one aspect there is provided an apparatus. The apparatus may include a controller module configured to decouple a phase detector from a loop filter of a receiver under test in response to synchronizing a margining clock signal to a receiver clock signal at a receiver clock signal frequency, the margining clock signal generated by an oscillator coupled to the loop filter; a margining input module configured to apply a margining input to the loop filter, the margining input configured to shift a frequency of the margining clock signal by a constant amount related to the margining input; a compare module configured to compare a first bit stream and a second bit stream, the comparing configured to detect an error, the first bit stream related to a transmitted bit stream received by the receiver under test; and a counter logic module configured to count cycles of the receiver clock signal or the margining clock signal, wherein an eye width associated with the receiver under test is related to the margining input, the frequency of the receiver clock signal and a count of clock cycles when an error is detected.

Another example apparatus includes the forgoing components and further includes a pseudo-random bit sequence (PRBS) generator configured to generate a pseudo-random bit sequence synchronized to the margining clock signal.

Another example apparatus includes the forgoing components and the first bit stream corresponds to a receiver bit stream the second bit stream corresponds to the pseudo-random bit sequence.

Another example apparatus includes the forgoing components and the first bit stream is a receiver bit stream and the second bit stream is related to the first bit stream.

Another example apparatus includes the forgoing components and the margining input corresponds to a voltage and the oscillator is a voltage controlled oscillator.

Another example apparatus includes the forgoing components and the margining input corresponds to a digital value and the oscillator is a digital controlled oscillator.

According to another aspect there is provided a method. The method may include decoupling a phase detector from a loop filter of a receiver under test in response to synchronizing a margining clock signal to a receiver clock signal at a receiver clock signal frequency; applying a margining input to the loop filter, the margining input configured to shift a frequency of the margining clock signal by a constant amount related to the margining input; comparing a first bit stream and a second bit stream, the first bit stream related to a transmitted bit stream received by the receiver under test, the comparing configured to detect an error; and counting cycles of the receiver clock signal or the margining clock signal, wherein an eye width associated with the receiver under test is related to the margining input, the frequency of the receiver clock signal and a count of clock cycles when the error is detected.

Another example method includes the forgoing operations and further includes generating a pseudo-random bit sequence synchronized to the margining clock signal.

Another example method includes the forgoing operations and the first bit stream is a receiver bit stream and the second bit stream is related to the first bit stream.

Another example method includes the forgoing operations and the first bit stream corresponds to a receiver bit stream and the second bit stream corresponds to the pseudo-random bit sequence.

Another example method includes the forgoing operations and further includes generating the first bit stream based, at least in part, on the margining clock signal.

Another example method includes the forgoing operations and further includes removing the margining input from the loop filter; recoupling the phase detector and the loop filter; delaying for a time interval configured to allow the margining clock signal and the receiver clock signal to synchronize; and halting the test if the margining clock signal and the receiver clock signal are not synchronized at the end of the time interval.

Another example method includes the forgoing operations and further includes removing the margining input from the loop filter after a time interval, the time interval corresponding to a phase shift between the receiver clock signal and the margining clock signal; and dwelling at the phase shift for a number M of clock cycles while comparing and counting.

According to one aspect there is provided a receiver. The receiver may include a clock and data recovery (CDR) module comprising a phase detector, a loop filter coupled to an output of the phase detector, and an oscillator coupled to an output of the loop filter, the oscillator configured to generate a margining clock signal; a data slicer module configured to receive the margining clock signal from the CDR module, to generate a first bit stream based, at least in part, on the margining clock signal and to provide a receiver clock signal to the CDR module, the first bit stream related to a transmitted bit stream received by the receiver; and eye measurement circuitry. The eye measurement circuitry may include a controller module configured to decouple the phase detector from the loop filter in response to synchronizing the margining clock signal with the receiver clock signal at a receiver clock signal frequency; a margining input module configured to apply a margining input to the loop filter, the margining input configured to shift a frequency of the margining clock signal by a constant amount related to the margining input; a compare module configured to compare the first bit stream and a second bit stream, the comparing configured to detect an error; and a counter logic module configured to count cycles of the receiver clock signal or the margining clock signal, wherein an eye width associated with the receiver under test is related to the margining input, the frequency of the receiver clock signal and a count of clock cycles when the error is detected.

Another example receiver includes the forgoing components and the data slicer module comprises a data slicer configured to provide a receiver bit stream.

Another example receiver includes the forgoing components and the data slicer module comprises a monitor slicer configured to provide the second bit stream, the second bit stream related to a monitor slicer reference voltage.

Another example receiver includes the forgoing components and the data slicer module comprises a monitor slicer configured to provide a monitor bit stream, the monitor bit stream related to a monitor slicer reference voltage configured to facilitate measuring the eye width at an amplitude corresponding to the monitor slicer reference voltage.

Another example receiver includes the forgoing components and the eye measurement circuitry further comprises a pseudo-random bit sequence (PRBS) generator configured to generate a pseudo-random bit sequence synchronized to the margining clock signal and further comprising a decision feedback equalizer coupled to the data slicer module and configured to receive the pseudo-random bit sequence.

Another example receiver includes the forgoing components and the oscillator is a voltage controlled oscillator or a digital controlled oscillator.

According to one aspect there is provided an apparatus. The apparatus may include a controller module configured to decouple a phase detector from a loop filter of a receiver under test in response to synchronizing a margining clock signal to a receiver clock signal at a receiver clock signal frequency, the margining clock signal generated by an oscillator coupled to the loop filter; a margining input module configured to apply a margining input to the loop filter, the margining input configured to shift a frequency of the margining clock signal by a constant amount related to the margining input; a compare module configured to compare a first bit stream and a second bit stream, the comparing configured to detect an error, the first bit stream related to a transmitted bit stream received by the receiver under test; and a counter logic module configured to count cycles of the receiver clock signal or the margining clock signal, wherein an eye width associated with the receiver under test is related to the margining input, the frequency of the receiver clock signal and a count of clock cycles when an error is detected.

Another example apparatus includes the forgoing components and further includes a pseudo-random bit sequence (PRBS) generator configured to generate a pseudo-random bit sequence synchronized to the margining clock signal wherein the first bit stream corresponds to a receiver bit stream and the second bit stream corresponds to the pseudo-random bit sequence.

Another example apparatus includes the forgoing components and the first bit stream is a receiver bit stream and the second bit stream is related to the first bit stream.

Another example apparatus includes the forgoing components and the margining input corresponds to a voltage and the oscillator is a voltage controlled oscillator or the margining input corresponds to a digital value and the oscillator is a digital controlled oscillator.

According to another aspect there is provided a method. The method may include decoupling a phase detector from a loop filter of a receiver under test in response to synchronizing a margining clock signal to a receiver clock signal at a receiver clock signal frequency; applying a margining input to the loop filter, the margining input configured to shift a frequency of the margining clock signal by a constant amount related to the margining input; comparing a first bit stream and a second bit stream, the first bit stream related to a transmitted bit stream received by the receiver under test, the comparing configured to detect an error; and counting cycles of the receiver clock signal or the margining clock signal, wherein an eye width associated with the receiver under test is related to the margining input, the frequency of the receiver clock signal and a count of clock cycles when the error is detected.

Another example method includes the forgoing operations and further includes generating a pseudo-random bit sequence synchronized to the margining clock signal, wherein the first bit stream corresponds to a receiver bit stream and the second bit stream corresponds to the pseudo-random bit sequence.

Another example method includes the forgoing operations and the first bit stream is a receiver bit stream and the second bit stream is related to the first bit stream.

Another example method includes the forgoing operations and further includes generating the first bit stream based, at least in part, on the margining clock signal.

Another example method includes the forgoing operations and further includes removing the margining input from the loop filter; recoupling the phase detector and the loop filter; delaying for a time interval configured to allow the margining clock signal and the receiver clock signal to synchronize; and halting the test if the margining clock signal and the receiver clock signal are not synchronized at the end of the time interval.

Another example method includes the forgoing operations and further includes removing the margining input from the loop filter after a time interval, the time interval corresponding to a phase shift between the receiver clock signal and the margining clock signal; and dwelling at the phase shift for a number M of clock cycles while comparing and counting.

According to one aspect there is provided a receiver. The receiver may include a clock and data recovery (CDR) module comprising a phase detector, a loop filter coupled to an output of the phase detector, and an oscillator coupled to an output of the loop filter, the oscillator configured to generate a margining clock signal; a data slicer module configured to receive the margining clock signal from the CDR module, to generate a first bit stream based, at least in part, on the margining clock signal and to provide a receiver clock signal to the CDR module, the first bit stream related to a transmitted bit stream received by the receiver; and eye measurement circuitry. The eye measurement circuitry may include a controller module configured to decouple the phase detector from the loop filter in response to synchronizing the margining clock signal with the receiver clock signal at a receiver clock signal frequency; a margining input module configured to apply a margining input to the loop filter, the margining input configured to shift a frequency of the margining clock signal by a constant amount related to the margining input; a compare module configured to compare the first bit stream and a second bit stream, the comparing configured to detect an error; and a counter logic module configured to count cycles of the receiver clock signal or the margining clock signal, wherein an eye width associated with the receiver under test is related to the margining input, the frequency of the receiver clock signal and a count of clock cycles when the error is detected.

Another example receiver includes the forgoing components and the data slicer module comprises a data slicer configured to provide a receiver bit stream.

Another example receiver includes the forgoing components and the data slicer module comprises a monitor slicer configured to provide the second bit stream, the second bit stream related to a monitor slicer reference voltage.

Another example receiver includes the forgoing components and the data slicer module comprises a monitor slicer configured to provide a monitor bit stream, the monitor bit stream related to a monitor slicer reference voltage configured to facilitate measuring the eye width at an amplitude corresponding to the monitor slicer reference voltage.

Another example receiver includes the forgoing components and the eye measurement circuitry further comprises a pseudo-random bit sequence (PRBS) generator configured to generate a pseudo-random bit sequence synchronized to the margining clock signal and further comprising a decision feedback equalizer coupled to the data slicer module and configured to receive the pseudo-random bit sequence.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. An apparatus comprising eye measurement circuitry, the eye measurement circuitry comprising a controller module, a margining input module, a compare module, and a counter logic module;
wherein:
  the controller module is configured to decouple a phase detector from a loop filter of a receiver under test in response to synchronizing a margining clock signal to a receiver clock signal at a receiver clock signal frequency, the margining clock signal generated by an oscillator coupled to the loop filter;
  the margining input module is to apply a margining input to the loop filter to shift a frequency of the margining clock signal by a constant amount related to the margining input;
  the compare module is to compare a first bit stream and a second bit stream to detect an error, wherein the first bit stream is related to a transmitted bit stream received by the receiver under test; and
  the counter logic module is to determine a count of clock cycles by counting cycles of the receiver clock signal or the margining clock signal;

the eye measurement circuitry is to determine an eye width associated with the receiver under test; and the eye width associated with the receiver under test is related to the margining input, the receiver clock signal frequency and the count of clock cycles-when the error is detected.

2. The apparatus of claim 1, wherein said eye measurement circuitry further comprises a pseudo-random bit sequence (PRBS) generator to generate a pseudo-random bit sequence synchronized to the margining clock signal.

3. The apparatus of claim 2, wherein the first bit stream corresponds to a receiver bit stream and the second bit stream corresponds to the pseudo-random bit sequence.

4. The apparatus of claim 1, wherein the first bit stream is a receiver bit stream and the second bit stream is related to the first bit stream.

5. The apparatus of claim 1, wherein the margining input corresponds to a voltage and the oscillator is a voltage controlled oscillator.

6. The apparatus of claim 1, wherein the margining input corresponds to a digital value and the oscillator is a digital controlled oscillator.

7. A method comprising, with eye measurement circuitry comprising a controller module, a margining input module, a compare module, and a counter logic module:

with the controller module, decoupling a phase detector from a loop filter of a receiver under test in response to synchronizing a margining clock signal to a receiver clock signal at a receiver clock signal frequency;

with the margining input module, applying a margining input to the loop filter to shift a frequency of the margining clock signal by a constant amount related to the margining input;

with the compare module, comparing a first bit stream and a second bit stream to detect an error, wherein the first bit stream is related to a transmitted bit stream received by the receiver under test;

with the counter logical module, determining a count of clock cycles by counting cycles of the receiver clock signal or the margining clock signal;

with the eye measurement circuitry, determining an eye width associated with the receiver under test, wherein an eye width associated with the receiver under test is related to the margining input, the frequency of the receiver clock signal and a count of clock cycles when the error is detected.

8. The method of claim 7, wherein said eye measurement circuitry further comprises a pseudo-random bit sequence (PRBS) generator and the method further comprises, with said PRBS generator, generating a pseudo-random bit sequence synchronized to the margining clock signal.

9. The method of claim 7, further comprising generating the first bit stream based, at least in part, on the margining clock signal.

10. The method of claim 7, further comprising:
removing the margining input from the loop filter;
recoupling the phase detector and the loop filter;
delaying for a time interval is to allow the margining clock signal and the receiver clock signal to synchronize; and
halting the test if the margining clock signal and the receiver clock signal are not synchronized at the end of the time interval.

11. The method of claim 7, further comprising:
removing the margining input from the loop filter after a time interval, the time interval corresponding to a phase shift between the receiver clock signal and the margining clock signal; and dwelling at the phase shift for a number M of clock cycles while comparing and counting.

12. The method of claim 7, wherein the first bit stream is a receiver bit stream and the second bit stream is related to the first bit stream.

13. The method of claim 8, wherein the first bit stream corresponds to a receiver bit stream and the second bit stream corresponds to the pseudo-random bit sequence.

14. A receiver comprising:

a clock and data recovery (CDR) module comprising a phase detector, a loop filter coupled to an output of the phase detector, and an oscillator coupled to an output of the loop filter, the oscillator to generate a margining clock signal;

a data slicer module to receive the margining clock signal from the CDR module, to generate a first bit stream based, at least in part, on the margining clock signal and to provide a receiver clock signal to the CDR module, the first bit stream related to a transmitted bit stream received by the receiver; and eye measurement circuitry comprising a controller module, a margining input module, a compare module, and a counter logic module;

wherein:
the controller module is to decouple the phase detector from the loop filter in response to synchronizing the margining clock signal with the receiver clock signal at a receiver clock signal frequency;

the margining input module is to apply a margining input to the loop filter to shift a frequency of the margining clock signal by a constant amount related to the margining input;

the compare module is to compare the first bit stream and a second bit stream to detect an error;

the counter logic module is to determine a count of clock cycles by counting cycles of the receiver clock signal or the margining clock signal;

the eye measurement circuitry is to determine an eye width associated with the receiver; and the eye width is related to the margining input, the frequency of the receiver clock signal and a count of clock cycles when the error is detected.

15. The receiver of claim 14, wherein the data slicer module comprises a data slicer to provide a receiver bit stream.

16. The receiver of claim 14, wherein the data slicer module comprises a monitor slicer to provide a monitor bit stream, the monitor bit stream related to a monitor slicer reference voltage to facilitate measuring the eye width at an amplitude corresponding to the monitor slicer reference voltage.

17. The receiver of claim 15, wherein the data slicer module comprises a monitor slicer to provide the second bit stream, the second bit stream related to a monitor slicer reference voltage.

18. The receiver of claim 14, wherein the eye measurement circuitry further comprises a pseudo-random bit sequence (PRBS) generator configured to generate a pseudo-random bit sequence synchronized to the margining clock signal.

19. The receiver of claim 18, further comprising a decision feedback equalizer coupled to the data slicer module, the decision feedback equalizer to receive the pseudo-random bit sequence.

20. The receiver of claim 14, wherein the oscillator is a voltage controlled oscillator or a digital controlled oscillator.

* * * * *